(12) United States Patent
Lin et al.

(10) Patent No.: US 9,134,564 B2
(45) Date of Patent: Sep. 15, 2015

(54) COLOR LIQUID CRYSTAL DISPLAY DEVICE

(75) Inventors: Bo-Hsuan Lin, Tainan (TW); Jung-Pin Hsu, Tainan (TW); Chung-En Cheng, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 978 days.

(21) Appl. No.: 13/242,867

(22) Filed: Sep. 23, 2011

(65) Prior Publication Data

US 2012/0162575 A1 Jun. 28, 2012

(30) Foreign Application Priority Data

Dec. 22, 2010 (TW) ................................ 99145224 A

(51) Int. Cl.
*G02F 1/1335* (2006.01)
*G03F 7/00* (2006.01)
*G03F 7/027* (2006.01)
*G03F 7/105* (2006.01)
*G02B 5/20* (2006.01)

(52) U.S. Cl.
CPC ........ *G02F 1/133514* (2013.01); *G03F 7/0007* (2013.01); *G03F 7/027* (2013.01); *G03F 7/105* (2013.01); *G02B 5/201* (2013.01); *G02F 2001/133624* (2013.01)

(58) Field of Classification Search
CPC ................................................. G02F 1/133514
USPC .................................................. 349/106–109
See application file for complete search history.

(56) References Cited

U.S. PATENT DOCUMENTS

2010/0208173 A1* 8/2010 Kawana et al. ................. 349/71

FOREIGN PATENT DOCUMENTS

| JP | H09-95638 A | 4/1997 |
|---|---|---|
| JP | H09-197663 A | 7/1997 |

* cited by examiner

*Primary Examiner* — Bumsuk Won
*Assistant Examiner* — Charles Chang
(74) *Attorney, Agent, or Firm* — Nath, Goldberg & Meyer; Jerald L. Meyer

(57) ABSTRACT

A color liquid crystal display device includes a liquid crystal display element and a backlight unit. The liquid crystal display element includes a color filter having a red filter segment, a green filter segment, and a blue filter segment. The blue filter segment is prepared from a blue photosensitive resin composition. The blue photosensitive resin composition includes a pigment combination, an alkali-soluble resin, a compound having an ethylenic group, and a photoinitiator. The pigment combination includes a copper phthalocyanine-based blue pigment. The color filter has a z value ranging from 0.3 to 0.5 in a chromaticity diagram of a XYZ color system. The backlight unit is coupled to the liquid crystal display element and has a color temperature ranging from 8,000 K to 20,000 K.

21 Claims, 2 Drawing Sheets

COLOR LIQUID CRYSTAL DISPLAY DEVICE

CROSS-REFERENCE TO RELATED APPLICATION

This application claims priority of Taiwanese Application No. 099145224, filed Dec. 22, 2010.

BACKGROUND OF THE INVENTION

1. Field of the Invention

This invention relates to a color liquid crystal display device, more particularly to a color liquid crystal display device capable of high color reproduction.

2. Description of the Related Art

Recently, liquid crystal display devices have been increasingly developed due to their characteristics, such as light weight, thin profile, and power saving, in the application of notebook computers and digital cameras. Generally, the color liquid crystal display devices for desktop computers have color reproduction ranging from about 50% to about 60% of NTSC (National Television Standards Committee) color gamut. The color reproduction of liquid crystal display television ranges from about 60% to about 75%. There is a need for a relatively broad range of color reproduction in the art.

A liquid crystal display device is generally configured with a trichrome backlight unit and a color filter. However, a combination of a backlight unit and a color filter of the prior art cannot satisfy the requirement of the color reproduction and the color tone for the liquid crystal display television. Therefore, there are problems of a narrow range of the color reproduction and a low color temperature. Additionally, in the case of a backlight unit for a desktop computer, when it is intended to produce a color filter having chromaticity specified in EBU (European Broadcasting Union) standard, it is often required to increase the film thickness and/or the pigment concentration for blue pixels of a color filter. Therefore, the light transmittance of the blue pixels is undesirably reduced, the display properties of the liquid crystal display are deteriorated, and the color temperature of the liquid crystal display device is also undesirably reduced.

Since phthalocyanine-based blue pigments have excellent light resistance and heat resistance, they are often used in the blue pixels of a color filter. Examples of the phthalocyanine-based blue pigments include C.I. Pigment Blue 6 (C.I. PB6), C.I, Pigment Blue 15 (C.I. PB15:1, 15:2, 15:3, 15:4, 15:5, and 15:6), C.I. Pigment Blue 21 (C.I. PB21), C.I. Pigment Blue 22 (C.I. PB22), C.I. Pigment Blue 28 (C.I. PB28), C.I. Pigment Blue 60 (C.I. PB60), and C.I. Pigment Blue 64 (C.I. PB64). Furthermore, violet pigments are used for adjusting the chromaticity of the blue pigments. Examples of the violet pigments include C.I. Pigment Violet 14 (C.I. PV14), C.I. Pigment Violet 19 (C.I. PV19), C.I. Pigment Violet 23 (C.I. PV23), C.I. Pigment Violet 29 (C. I. PV29), C. I. Pigment Violet 32 (C. I. PV32), C.I. Pigment Violet 33 (C.I. PV33), C.I. Pigment Violet 36 (C.I. PV36), C.I. Pigment Violet 37 (C.I. PV37), C.I. Pigment Violet 38 (C.I. PV38), C.I. Pigment Violet 40 (C.I. PV40), and C.I. Pigment Violet 50 (C.I. PV50).

JP 09-095638 discloses a blue pigment composition for a color filter, which comprises alpha-copper phthalocyanine blue pigment and epsilon-copper phthalocyanine blue pigment.

JP 09-197663 discloses another blue pigment composition for a color filter, which comprises copper phthalocyanine blue pigment and indanthrone blue pigment.

The blue pixels made of the blue pigments as described above have relatively low light transmittance. Therefore, there is a problem of insufficient light transmittance when the blue pixels are used to produce a color filter required for superior color reproduction. A color liquid crystal display having high definition cannot be provided thereby. Additionally, a color liquid crystal display having a satisfactory broad range of color reproduction cannot be obtained from a combination of the aforesaid color filter made of the blue pigments with a light source of the prior art.

Therefore, it is still required in the art to provide a color liquid crystal display device having high color reproduction.

SUMMARY OF THE INVENTION

An object of the present invention is to provide a color liquid crystal display device having high color reproduction.

The color liquid crystal display device according to this invention includes a liquid crystal display element and a backlight unit. The liquid crystal display element includes a color filter having a red filter segment, a green filter segment, and a blue filter segment. The blue filter segment is prepared from a blue photosensitive resin composition. The blue photosensitive resin composition includes a pigment combination, an alkali-soluble resin, a compound having an ethylenic group, and a photoinitiator. The pigment combination includes a copper phthalocyanine-based blue pigment. The color filter has a z value ranging from 0.3 to 0.5 in a chromaticity diagram of a XYZ color system. The backlight unit is coupled to the liquid crystal display element and has a color temperature ranging from 8,000 K to 20,000 K.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
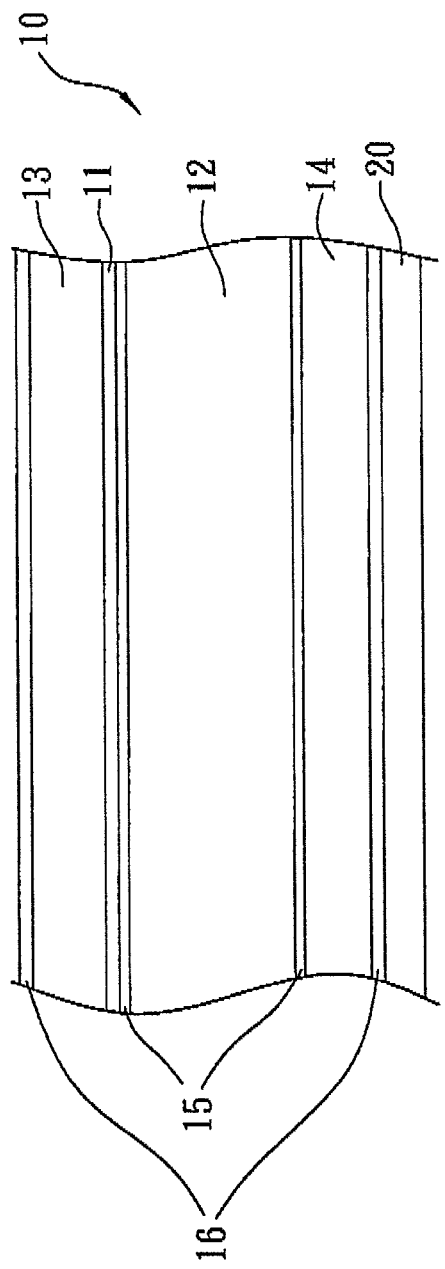
FIG. 1 is a fragmentary schematic view of a preferred embodiment of a color liquid crystal display device according to this invention.

Referring to FIG. 1, the preferred embodiment of the color liquid crystal display device according to this invention includes a liquid crystal display element 10 and a backlight unit 20.

The liquid crystal display element 10 includes a first substrate 13, a second substrate 14 spaced apart from the first substrate 13, a color filter 11 coupled to the first substrate 13, two alignment layers 15 respectively disposed on the color filter 11 and the second substrate 14 and facing toward each other, liquid crystal 12 disposed between the alignment layers 15, and two polarizers 16 respectively coupled to the first and second substrates 13, 14 and distal from the liquid crystal 12. The first substrate 13 is a color filter side substrate, and the second substrate 14 is a thin film transistor side substrate.

The color filter 11 has a red filter segment, a green filter segment, and a blue filter segment. The blue filter segment is prepared from a blue photosensitive resin composition which includes a pigment combination, an alkali-soluble resin, a compound having an ethylenic group, and a photoinitiator. The pigment combination includes a copper phthalocyanine-based blue pigment. The color filter has a z value ranging from 0.3 to 0.5 in a chromaticity diagram of a XYZ color system. When the z value is out of the range from 0.3 to 0.5, the color reproduction of the color liquid crystal display device obtained thereby is unsatisfactory.

Preferably, the pigment combination further includes a dioxazine-based violet pigment. The weight ratio of the copper phthalocyanine-based blue pigment to the dioxazine-based violet pigment is generally not less than 60/40, preferably not less than 70/30. Notably, the greater the weight ratio, the better will be the color reproduction. Therefore, the weight ratio of the copper phthalocyanine-based blue pigment to the dioxazine-based violet pigment ranges preferably from 60/40 to 90/10, more preferably from 70/30 to 90/10, and most preferably from 80/20 to 90/10.

The pigment combination is used in an amount ranging generally from 100 to 800 parts by weight, preferably from 150 to 600 parts by weight, and more preferably from 200 to 500 parts by weight, based on 100 parts by weight of the alkali-soluble resin.

Specifically, the copper phthalocyanine-based blue pigment is used in an amount ranging generally from 20 to 250 parts by weight, preferably from 40 to 200 parts by weight, and more preferably from 60 to 150 parts by weight, based on 100 parts by weight of the alkali-soluble resin. The dioxazine-based violet pigment is used in an amount ranging preferably from 0 to 15 parts by weight, based on 100 parts by weight of the alkali-soluble resin. The total amount of the copper phthalocyanine-based blue pigment and the dioxazine-based violet pigment is not less than 80 wt % based on a weight of the pigment combination.

Preferably, examples of the copper phthalocyanine-based blue pigment include, but are not limited to, C.I. Pigment Blue 6 (C.I. PB6), C.I. Pigment Blue 15 (C.I. PB15:1, 15:2, 15:3, 15:4, 15:5, and 15:6), C.I. Pigment Blue 21 (C.I. PB21), C.I. Pigment Blue 22 (C.I. PB22) C.I. Pigment Blue 28 (C.I. PB28), C.I. Pigment Blue 60 (C.I. PB60), C.I. Pigment Blue 64 (C.I. PB64), and combinations thereof. Preferably, the copper phthalocyanine-based blue pigment contains C.I. Pigment Blue 15:4, 15:6, or a combination thereof in an amount not less than 80 wt % based on the weight of the copper phthalocyanine-based blue pigment.

Examples of the dioxazine-based violet pigment include, but are not limited to, C.I. Pigment Violet 14 (C.I. PV14), C.I. Pigment Violet 19 (C.I. PV19), C.I. Pigment Violet 23 (C. I. PV23), C.I. Pigment Violet 29 (C.I. PV29), C.I. Pigment Violet 32 (C.I. PV32), C.I. Pigment Violet 33 (C.I. PV33), C.I. Pigment Violet 36 (C.I. PV36), C.I. Pigment Violet 37 (C.I. PV37), C.I. Pigment Violet 38 (C.I. PV38), C.I. Pigment Violet 40 (C.I. PV40), C.I. Pigment Violet 50 (C.I. PV50), and combinations thereof. Preferably, the dioxazine-based violet pigment contains C.I. Pigment Violet 23 in an amount not less than 15 wt % based on a weight of the dioxazine-based violet pigment.

The micronization of the mean particle size of the primary particles of the pigment combination can be conducted by a grinding method in which the pigment combination is mechanically ground, a precipitation method in which the pigment combination is dissolved in a good solvent and then is precipitated using a poor solvent, or a synthetic precipitation in which the pigment combination of finer particle size is produced in the synthesis process of the pigment combination. The mean particle size of the primary particles of the pigment combination ranges generally from 10 to 200 nm, preferably from 20 to 150 nm, and more preferably from 30 to 100 nm.

The pigment combination can be used in combination with a dispersant, if necessary. Examples of the dispersant include, but are not limited to, cationic surfactants, anionic surfactants, nonionic surfactants, amphoteric surfactants, silicone-based surfactants, and fluorine-based surfactants. Examples of the surfactants include polyethylene oxide alkyl ethers, such as polyethylene oxide dodecyl ether, polyethylene oxide stearoyl ether, polyethylene oxide oleyl ether, or the like; polyethylene oxide alkyl phenyl ethers, such as polyethylene oxide octyl phenyl ether, polyethylene oxide nonyl phenyl ether, or the like; polyethylene glycol diesters, such as polyethylene glycol dilaurate, polyethylene glycol distearate, or the like; sorbitan fatty acid esters; fatty acid modified polyesters; tertiary amine modified polyurethanes; or the like. Examples of the commercial surfactants include KP manufactured by Shin-Etsu Chemical Col, Ltd., SF-8427 manufactured by Toray Dow Corning Silicon, Polyflow manufactured by Kyoeisha Chemical Co., Ltd., F-Top manufactured by Tochem Products Co., Ltd., Megafac manufactured by Dainippon Ink and Chemicals, Incorporated, Fluorade manufactured by Sumitomo 3M, Asahi Guard and Surfion both manufactured by Asahi Glass, or the like. The above examples of the surfactant may be used alone or in combinations thereof.

An additional green pigment can be added into the pigment combination so as to adjust the chromaticity of the pigment combination. Examples of the additional green pigment include, but are not limited to, halogenated phthalocyanines. Preferably, the green pigment is selected from C.I. Pigment Green 7 (C.I. PG7), C.I. Pigment Green 36 (C.I. PG36), and C.I. Pigment Green 58 (C.I. PG58). These green pigments can be used alone or in combinations thereof. The green pigment is used in an amount ranging generally from 5 to 25 parts by weight, based on 100 parts by weight of the alkali-soluble resin.

The alkali-soluble resin is obtained by subjecting an ethylenically unsaturated monomer having one or more carboxyl groups and another copolymerizable ethylenically unsaturated monomer to conduct a copolymerization. Preferably, the amounts of the ethylenically unsaturated monomer having one or more carboxyl groups and the another copolymerizable ethylenically unsaturated monomer used in the copolymerization reaction are 50-95 parts by weight and 5-50 parts by weight, respectively, based on 100 parts by weight of the sum of the ethylenically unsaturated monomer having one or more carboxyl groups and the another copolymerizable ethylenically unsaturated monomer.

Examples of the aforementioned ethylenically unsaturated monomer having one or more carboxyl groups include, but are not limited to, unsaturated monocarboxylic acids and/or esters thereof, such as acrylic acid, methacrylic acid, butenoic acid, α-chloroacrylic acid, ethacrylic acid, cinnamic acid, 2-acryloylethoxy succinate, 2-methacryloylethoxy succinate, or the like; unsaturated dicarboxylic acids and/or anhydrides thereof, such as maleic acid, maleic anhydride, fumaric acid, itaconic acid, itaconic anhydride, citraconic acid, citraconic anhydride, or the like; and unsaturated polycarboxylic acids having at least three carboxyl groups in the molecules and/or anhydrides thereof; or the like. Preferably, the ethylenically unsaturated monomer having one or more carboxyl groups is selected from acrylic acid, methacrylic acid, 2-acryloylethoxy succinate, and 2-methacryloylethoxy succinate. More preferably, the ethylenically unsaturated monomer having one or more carboxyl groups is selected from 2-acryloylethoxy succinate and 2-methacryloylethoxy succinate. The ethylenically unsaturated monomer having one or more carboxyl groups is used for increasing the pigment dispersion, enhancing the development speed, and reducing the residue.

Examples of the another copolymerizable ethylenically unsaturated monomer include, but are not limited to, vinyl aromatic compounds, such as styrene, α-methyl styrene, o-vinyl toluene, p-chlorostyrene, methoxystyrene, or the like; maleimides, such as N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, N-cyclohexylmaleimide, or the like; unsaturated carboxylates, such as methyl acrylate, methyl methacrylate, ethyl acrylate, ethyl methacrylate, n-propyl acrylate, n-propyl methacrylate, iso-propyl acrylate, iso-propyl methacrylate, n-butyl acrylate, n-butyl methacrylate, iso-butyl acrylate, iso-butyl methacrylate, sec-butyl acrylate, sec-butyl methacrylate, tert-butyl acrylate, tort-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, phenyl acrylate, phenyl methacrylate, methoxy triethylene glycol acrylate, methoxy triethylene glycol methacrylate, lauryl methacrylate, tetradecyl methacrylate, cetyl methacrylate, octadecyl methacrylate, eicosyl methacrylate, docosyl methacrylate, dicyclopentenyloxyethyl acrylate, or the like; unsaturated amino alkyl carboxylates, such as N,N-dimethyl aminoethyl acrylate, N,N-dimethyl aminoethyl methacrylate, N,N-diethyl aminopropyl acrylate, N,N-dimethyl aminopropyl methacrylate, N,N-dibutyl aminopropyl acrylate, N-t-butyl aminoethyl methacrylate, or the like; unsaturated glycidyl carboxylates, such as glycidyl acrylate, glycidyl methacrylate, or the like; vinyl carboxylates, such as vinyl acetate, vinyl propionate, vinyl butyrate, or the like; unsaturated ethers, such as vinyl methyl ether, vinyl ethyl ether, allyl glycidyl ether, methallyl glycidyl ether, or the like; vinyl cyanides, such as acrylonitrile, methyl acrylonitrile, α-chloroacrylonitrile, vinylidene cyanide, or the like; unsaturated amides, such as acrylamide, methacrylamide, α-chloroacrylamide, N-hydroxyethyl acrylamide, N-hydroxyethyl methacrylamide, or the like; and aliphatic conjugate dienes, such as 1,3-butadiene, iso-propylene, chloroprene, or the like.

Preferably, the another copolymerizable ethylenically unsaturated monomer is selected from styrene, N-phenylmaleimide, methyl acrylate, methyl methacrylate, 2-hydroxyethyl acrylate, 2-hydroxyethyl methacrylate, benzyl acrylate, benzyl methacrylate, and dicyclopentenyloxyethyl acrylate. The examples thereof can be used alone or in admixture of two or more.

Examples of the solvent suitable for preparing the alkali-soluble resin include, but are not limited to, (poly)alkylene glycol monoalkyl ethers, such as ethylene glycol methyl ether, ethylene glycol ethyl ether, diethylene glycol methyl ether, diethylene glycol ethyl ether, diethylene glycol n-propyl ether, diethylene glycol n-butyl ether, triethylene glycol methyl ether, triethylene glycol ethyl ether, propylene glycol methyl ether, propylene glycol ethyl ether, dipropylene glycol methyl ether, dipropylene glycol ethyl ether, dipropylene glycol n-propyl ether, dipropylene glycol n-butyl ether, tripropylene glycol methyl ether, tripropylene glycol ethyl ether, or the like; (poly)alkylene glycol monoalkyl ether acetates, such as ethylene glycol methyl ether acetate, ethylene glycol ethyl ether acetate, propylene glycol methyl ether acetate, propylene glycol ethyl ether acetate, or the like; other ethers, such as diethylene glycol dimethyl ether, diethylene glycol methyl ethyl ether, diethylene glycol diethyl ether, tetrahydrofuran, or the like; ketones, such as methyl ethyl ketone, cyclohexanone, 2-heptanone, 3-heptanone, or the like; alkyl lactate, such as methyl 2-hydroxypropionate, ethyl 2-hydroxypropionate, or the like; other esters, such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxy acetate, ethyl hydroxy acetate, methyl 2-hydroxy-3-methylbutyrate, 3-methyl-3-methoxybutyl acetate, 3-methyl-3-methoxybutyl propionate, ethyl acetate, n-propyl acetate, iso-propyl acetate, n-butyl acetate, iso-butyl acetate, n-amyl acetate, iso-amyl acetate, n-butyl propionate, ethyl butyrate, n-propyl butyrate, iso-propyl butyrate, n-butyl butyrate, methyl pyruvate, ethyl pyruvate, n-propyl pyruvate, methyl acetoacetate, ethyl acetoacetate, ethyl 2-oxobutyrate, or the like; aromatic hydrocarbons, such as toluene, xylene, or the like; and carboxylic acid amide, such as N-methyl-2-pyrrolidone, N,N-dimethylformamide, N,N-dimethylacetamide, or the like. Preferably, the solvent is selected from propylene glycol methyl ether acetate and ethyl 3-ethoxypropionate. The aforesaid examples of the solvent can be used alone or in admixture of two or more thereof.

The initiator used for preparing the alkali-soluble resin is a free radical polymerization initiator, examples of which include, but are not limited to, azo compounds, such as 2,2'-azobisisobutyronitrile, 2,2'-azobis-(2,4-dimethylvaleronitrile), 2,2'-azobis-(4-methoxy-2,4-dimethylvaleronitrile), 2,2'-azobis-2-methylbutyronitrile, or the like; and peroxides, such as benzoyl peroxide, or the like.

The compound having an ethylenic group used in the present invention is a compound having one or more ethylenically unsaturated groups.

Examples of the compound having one ethylenically unsaturated group include, but are not limited to, acrylamide, (meth)acryloylmorpholine, 7-amino-3,7-dimethyloctyl (meth)acrylate, iso-butoxymethyl(meth)acrylamide, iso-bornyloxyethyl(meth)acrylate, iso-bornyl(meth)acrylate, 2-ethylhexyl(meth)acrylate, ethyl diethylene glycol(meth)acrylate, t-octyl(meth)acrylamide, diacetone(meth)acrylamide, dimethylaminoethyl(meth)acrylate, dodecyl(meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxy ethyl(meth)acrylate, tetrahydrofurfuryl(meth)acrylate, tetrabromophenyl(meth)acrylate, 2-tetrabromophenoxyethyl (meth)acrylate, 2-trichlorophenoxyethyl(meth)acrylate, tribromophenyl(meth)acrylate, 2-tribromophenoxyethyl(meth)acrylate, 2-hydroxyethyl(meth)acrylate, 2-hydroxypropyl(meth)acrylate, vinylcaprolactam, N-vinylpyrrolidone, phenoxyethyl(meth)acrylate, pentachlorophenyl(meth)acrylate, pentabromophenyl(meth)acrylate, polyethylene glycol mono(meth)acrylate, polypropylene glycol mono(meth)acrylate, bornyl(meth)acrylate, or the like.

Examples of the compound having two or more ethylenically unsaturated groups include, but are not limited to, ethylene glycol di(meth)acrylate, dicyclopentenyl di(meth)acrylate, triethylene glycol diacrylate, tetraethylene glycol di(meth)acrylate, tri(2-hydroxyethyl) isocyanate di(meth)acrylate, tri(2-hydroxyethyl) isocyanate tri(meth)acrylate, caprolactone-modified tri(2-hydroxyethyl) isocyanate tri (meth)acrylate, trimethylol propyl tri(meth)acrylate, ethylene oxide (hereinafter abbreviated as EO) modified trimethylolpropyl tri(meth)acrylate, propylene oxide (hereinafter abbreviated as PO) modified trimethylolpropyl tri(meth) acrylate, tripropylene glycol di(meth)acrylate, neo-pentyl glycol di(meth)acrylate, 1,4-butanediol di(meth)acrylate, 1,6-hexanediol di(meth)acrylate, pentaerythritol tri(meth)

acrylate, pentaerythritol tetra(meth)acrylate, polyester di(meth)acrylate, polyethylene glycol di(meth)acrylate, dipentaerythritol hexa(meth)acrylate, dipentaerythritol penta (meth)acrylate, dipentaerythritol tetra(meth)acrylate, caprolactone-modified dipentaerythritol hexa(meth)acrylate, caprolactone-modified dipentaerythritol penta(moth)acrylate, ditrimethylolpropyl tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol triacrylate, EO-modified bisphenol F di(meth)acrylate, phenol novolac polyglycidyl ether(meth)acrylate, or the like.

Preferably, the compound having an ethylenic group is selected from trimethylolpropyl triacrylate, EO-modified trimethylolpropyl triacrylate, PO-modified trimethylolpropyl triacrylate, pentaerythritol triacrylate, pentaerythritol tetracrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, and PO-modified glycerol triacrylate. The aforesaid examples of the compound having an ethylenic group can be used alone or in admixture of two or more thereof.

The compound having an ethylenic group is used in an amount ranging generally from 10 to 500 parts by weight, preferably from 30 to 400 parts by weight, and more preferably from 50 to 300 parts by weight, based on 100 parts by weight of the alkali-soluble resin.

The photoinitiator suitable for the present invention is selected from O-acyloxime compounds, triazine compounds, acetophenone compounds, biimidazole compounds, or benzophenone compounds. The photoinitiator is used in an amount ranging generally from 2 to 200 parts by weight, preferably from 5 to 180 parts by weight, and more preferably from 10 to 150 parts by weight, based on 100 parts by weight of the alkali-soluble resin.

Examples of the O-acyloxime compounds include, but are not limited to, 1-[4-(phenylthio)phenyl]-heptane-1,2-dione 2-(O-benzoyloxime), 1-[4-(phenylthio)phenyl]-octane-1,2-dione 2-(O-benzoyloxime), 1-[4-(benzoyl)phenyl]-heptane-1,2-dione 2-(O-benzoyloxime), 1-[9-ethyl-6-(2-methylbenzoyl)-9H-carbazol-3-yl]-ethylketo 1-(O-acetyloxime), 1-[9-ethyl-6-(3-methylbenzoyl)-9H-carbazol-3-yl]-ethylketo 1-(O-acetyloxime), 1-[9-ethyl-6-benzoyl-9H-carbazol-3-yl]-ethylketo 1-(O-acetyloxime), ethylketo-1-[9-ethyl-6-(2-methyl-4-tetrahydrofurylbenzoyl)-9H-carbazol-3-yl]-1-(O-acetyloxime), ethylketo-1-[9-ethyl-6-(2-methyl-4-tetrapyranylbenzoyl)-9H-carbazol-3-yl]-1-(O-acetyloxime), ethylketo-1-[9-ethyl-6-(2-methyl-5-tetrafurylbenzoyl)-9H-carbazol-3-yl]-1-(O-acetyloxime), ethylketo-1-[9-ethyl-6-(2-methyl-5-tetrapyranylbenzoyl)-9H-carbazol-3-yl]-1-(O-acetyloxime), ethylketo-1-[9-ethyl-6-(2-methyl-4-tetrafurylmethoxybenzoyl)-9H-carbazol-3-yl]-1-(O-acetyloxime), ethylketo-1-[9-ethyl-6-(2-methyl-4-tetrapyranylmethoxybenzoyl)-9H-carbazol-3-yl]-1-(O-acetyloxime), ethylketo-1-[9-ethyl-6-(2-methyl-5-tetrafurylmethoxybenzoyl)-9H-carbazol-3-yl]-1-(O-acetyloxime), ethylketo-1-[9-ethyl-6-(2-methyl-5-tetrapyranylmethoxybenzoyl)-9H-carbazol-3-yl]-1-(O-acetyloxime), ethylketo-1-[9-ethyl-6-{2-methyl-4-(2,2-dimethyl-1,3-dioxolyl)benzoyl}-9H-carbazol-3-yl]-1-(O-acetyloxime), ethylketo-1-[9-ethyl-6-{2-methyl-4-(2,2-dimethyl-1,3-dioxolyl)methoxybenzoyl}-9H-carbazol-3-yl]-1-(O-acetyloxime), or the like.

Examples of the triazine compounds include, but are not limited to, 2,4-bis(trichloromethyl)-6-(p-methoxy)styryl-s-triazine, 2,4-bis(trichloromethyl)-6-(1-p-dimethylaminophenyl-1,3-butadienyl)-s-triazine, 2-trichloromethyl-4-amino-6-(p-methoxy)styryl-s-triazine, or the like.

Examples of the acetophenone compounds include, but are not limited to, p-dimethylaminoacetophenone, α,α'-dimethoxyazoxyacetophenone, 2,2'-dimethyl-2-phenylacetophenone, p-methoxyacetophenone, 2-methyl-1-(4-methylthiophenyl)-2-morpholino-1-propan one, 2-benzyl-2-N,N-dimethylamino-1-(4-morpholinophenyl)-1-butanone, or the like.

Examples of the biimidazole compounds include, but are not limited to, 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole, 2,2'-bis(o-methoxyphenyl)-4,4',5,5'-tetraphenylbiimidazole, 2,2'-bis(o-ethylphenyl)-4,4',5,5'-tetraphenylbiimidazole, 2,2'-bis(p-methoxyphenyl)-4,4',5,5'-tetraphenylbiimidazole, 2,2'-bis(2,2',4,4'-tetramethoxyphenyl)-4,4',5,5'-tetraphenylbiimidazole, 2,2'-bis(2-chlorophenyl)-4,4',5,5'-tetraphenylbiimidazole, 2,2'-bis(2,4-dichlorophenyl)-4,4',5,5'-tetraphenylbiimidazole, or the like.

Examples of the benzophenone compounds include, but are not limited to, thioxanthone, 2,4-diethylthioxanthone, thioxanthone-4-sulfone, benzophenone, 4,4'-bis(dimethylamino)benzophenone, 4,4'-bis(diethylamino)benzophenone, or the like.

Preferably, the photoinitiator is selected from 1-[4-(phenylthio)phenyl]-octane-1,2-dione 2-(O-benzoyloxime), 1-[9-ethyl-6-(2-methylbenzoyl)-9H-carbazol-3-yl]-ethylketo 1-(O-acetyloxime), ethylketo-1-[9-ethyl-6-(2-methyl-4-tetrahydrofurylmethoxybenzoyl)-9H-carbazol-3-yl]-1-(O-acetyloxime), ethylketo-1-[9-ethyl-6-(2-methyl-4-(2,2-dimethyl-1,3-dioxolyl)methoxybenzoyl)-9H-carbazol-3-yl]-1-(O-acetyloxime), 2,4-bis(trichloromethyl)-6-(p-methoxy)styryl-s-triazine, 2-benzyl-2-N,N-dimethylamino-1-(4-morpholinophenyl)-1-butanone, 2,2'-bis(2,4-dichlorophenyl)-4,4',5,5'-tetraphenylbiimidazole, and 4,4'-bis(diethylamino)benzophenone.

In addition to the aforesaid photoinitiators, other initiators can be further added into the blue photosensitive resin composition of the present invention. Examples of the other initiators include, but are not limited to, α-diketone compounds, such as benzil, acetyl, or the like; acyloin compounds, such as benzoin, or the like; acyloin ether compounds, such as benzoin methyl ether, benzoin ethyl ether, benzoin isopropyl ether, or the like; acylphosphine oxide compounds, such as 2,4,6-trimethylbenzoyl diphenylphosphine oxide, bis-(2,6-dimethoxybenzoyl)-2,4,4-trimethyl benzyl phosphine oxide, or the like; quinone compounds, such as anthraquinone, 1,4-naphthoquinone, or the like; halide compounds, such as phenacyl chloride, tribromomethyl phenylsulfone, tris(trichloromethyl)-s-triazine, or the like; and peroxide compounds, such as di-tert-butyl peroxide; or the like.

All the above components except the pigment combination are generally dissolved in an appropriate organic solvent to prepare a liquid composition, and the pigment combination is then mixed with the liquid composition to prepare the blue photosensitive resin composition. Any solvents, which are inert to and can disperse or dissolve the alkali-soluble resin, the compound having an ethylenic group, and the photoinitiator and which have appropriate volatility, can be used. The organic solvent for preparing the blue photosensitive resin composition is used in an amount ranging generally from 500 to 5,000 parts by weight, preferably from 800 to 4,500 parts by weight, and more preferably from 1,000 to 4,000 parts by weight, based on 100 parts by weight of the alkali-soluble resin. The organic solvent suitable for preparing the blue photosensitive resin composition can be selected from the examples of the solvent for preparing the alkali-soluble resin. Preferably, the organic solvent suitable for preparing the blue photosensitive resin composition is propylene glycol methyl ether acetate or ethyl 3-ethoxypropionate.

The blue photosensitive resin composition in the present invention can contain other additives, such as fillers, polymers other than the alkali-soluble resin, adhesion agents, antioxidants, UV absorbents, anti-coagulants, or the like according to the specific requirements for the physical and/or chemical properties of the blue filter segment is prepared from the blue photosensitive resin composition.

Examples of the fillers include glass, alumina, or the like. Examples of the polymers other than the alkali-soluble resin include polyvinyl alcohol, polyethylene glycol monoalkyl ether, polyfluoro alkyl acrylate, or the like. Examples of the adhesion agents include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxypropyltrimethoxysilane, 3-glycidyloxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, or the like. Examples of the antioxidants include 2,2-thiobis(4-methyl-6-t-butylphenol), 2,6-di-t-butylphenol, or the like. Examples of the UV absorbents include 2-(3-t-butyl-5-methyl-2-hydroxyphenyl)-5-chlorobenzotriazole, alkoxybenzophenone, or the like. Examples of the anti-coagulants include sodium polyacrylate, or the like. The other additives are used in an amount ranging generally from 0 to 10 parts by weight, preferably from 0 to 6 parts by weight, and more preferably from 0 to 3 parts by weight, based on 100 parts by weight of the alkali-soluble resin.

The green filter segment and the red filter segment in the present invention can be made of a conventional green photosensitive resin composition and a conventional red photosensitive resin composition, respectively. The components of the green and red photosensitive resin compositions are substantially identical to those of the blue photosensitive resin composition except that instead of the pigment combination used in the blue photosensitive resin composition, a green pigment is used in the green photosensitive resin composition whereas a red pigment is used in the red photosensitive resin composition. Examples of the green pigment include, but are not limited to, C.I. Pigment Green 07, 36, 37, 58, alone or in combinations thereof, combined with C.I. Pigment Yellow 12, 13, 14, 17, 20, 24, 31, 55, 83, 93, 109, 110, 128, 138, 139, 150, 153, 154, 155, 166, 168, 180, 185, 211, 219, alone or in combinations thereof. Preferably, the green pigment includes, but is not limited to, C.I. Pigment Green 07, 36, 58, alone or in combinations thereof, with C.I. Pigment Yellow 13, 138, 139, 150, alone or in combinations thereof. Examples of the red pigment include, but are not limited to, an azo-based red pigment, such as C.I. Pigment Red 83, C.I. Pigment Red 89, C.I. Pigment Red 177, and an anthraquinone-based red pigment, such as C.I. Pigment Red 144, C.I. Pigment Red 166, C.I. Pigment Red 214, C.I. Pigment Red 220, C.I. Pigment Red 221, C.I. Pigment Red 242, C.I. Pigment Red 248, C.I. Pigment Red 262, and combinations thereof. More preferably, the azo-based red pigment is C.I. Pigment Red 89, C.I. Pigment Red 177, or a combination thereof, and the anthraquinone-based red pigment is C.I. Pigment Red 166, C.I. Pigment Red 242, or a combination thereof.

An additional red pigment and/or a yellow pigment can be added so as to adjust the chromaticity of the red pigment. Examples of the additional red pigment include, but are not limited to, quinacridones, perylenes, pyranthrene-8,16-diones, and combinations thereof. Examples of the yellow pigment include, but are not limited to, isoindoles, quinaphthalones, anthraquinones, and combinations thereof. Preferably, the yellow pigment is selected from quinaphthalones. More preferably, the yellow pigment is selected from C.I. Pigment Yellow 1, C.I. Pigment Yellow 3, C.I. Pigment Yellow 10, C.I. Pigment Yellow 12, C.I. Pigment Yellow 13, C. I. Pigment Yellow 14, C.I. Pigment Yellow 17, C.I. Pigment Yellow 20, C.I. Pigment Yellow 24, C.I. Pigment Yellow 31, C.I. Pigment Yellow 55, C.I. Pigment Yellow 81, C.I. Pigment Yellow 83, C.I. Pigment Yellow 93, C.I. Pigment Yellow 94, C.I. Pigment Yellow 97, C.I. Pigment Yellow 109, C.I. Pigment Yellow 110, C.I. Pigment Yellow 128, C.I. Pigment Yellow 138, C.I. Pigment Yellow 139, C.I. Pigment Yellow 150, C.I. Pigment Yellow 153, C.I. Pigment Yellow 154, C.I. Pigment Yellow 155, C.I. Pigment Yellow 166, C.I. Pigment Yellow 167, C.I. Pigment Yellow 168, C.I. Pigment Yellow 180, C.I. Pigment Yellow 185, C.I. Pigment Yellow 211, C.I. Pigment Yellow 219, or the like. These yellow pigments can be used alone or in combinations thereof. The yellow pigment is preferably selected from C.I. Pigment Yellow 83, C.I. Pigment Yellow 138, C.I. Pigment Yellow 139, C.I. Pigment Yellow 150, C.I. Pigment Yellow 185, C.I. Pigment Yellow 219, and combinations thereof in consideration of color purity and transparency.

In the following illustrative examples, the green pigment is a combination of C.I. Pigment Green 58 and C.I. Pigment Yellow 150, and the red pigment is a combination of C.I. Pigment Red 177, C.I. Pigment Red 166, and C.I. Pigment Yellow 150.

The blue photosensitive resin composition in a liquid state for the color filter in the present invention can be formed by blending the alkali-soluble resin, the compound having an ethylenic group, and the photoinitiator with the pigment combination in the organic solvent using a mixer. The blue photosensitive resin composition is coated on a substrate by a spin coating method, a slit coating method, an ink-jet coating method, a roller coating method, or the like, and is then dried under reduced pressure to remove most of the solvent. After completely evaporating the residual solvent by pre-baking, a coating film is formed. Operation conditions for the drying under reduced pressure and the pre-baking depend on kinds and amounts of the components used in the blue photosensitive resin composition. In general, the drying under reduced pressure is carried out at a pressure from 0 to 200 mm Hg for a period from 1 to 60 seconds. The pre-baking is carried out at a temperature from 70° C. to 110° C. for a period from 1 to 15 minutes. The coating film is then exposed to UV light through a specific photo mask, and is developed in a developer solution at a temperature of 23±2° C. for a period from 15 seconds to 5 minutes to dissolve and remove the unexposed portions of the coating film so as to obtain a desired pattern. The substrate with the desired pattern of the coating film is washed with water, is dried with compressed air or compressed nitrogen, and is heated at a temperature from 100 to 280° C. for a period of 1 to 15 minutes in a heating device, such as a hot plate or an oven so as to remove evaporative components and to subject the unreacted ethylenic compound contained in the coating film to conduct a heat curing reaction. The blue filter segment can be obtained thereby. The green and red filter segments can be obtained using the green and red photosensitive resin compositions, respectively, following the procedure for making the blue filter segment. A color filter can be obtained thereby. However, the order of the procedure for making the filter segments is not limited to the above-mentioned description.

The UV light used for the exposure of the coating film can be g line, h line, i line, or the like. The UV lamp for providing the UV light is a (ultra)high-pressure mercury lamp or a metal halide lamp. The substrate used to form the color filter is made from bare glass, soda glass, Pyrex glass, silica glass, or any one of these glass coated with a transparent conductive film, or a transparent electrode substrate used in solid state image pick up devices. A black matrix is formed on the substrate to separate each color pixel element.

The developer solution is preferably an alkali aqueous solution of sodium hydroxide, potassium hydroxide, sodium carbonate, sodium hydrogencarbonate, potassium carbonate, potassium hydrogencarbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, 1,8-diaza-bicyclo(5,4,0)-7-undecene, or the like. The concentration of the developer in the solution is from 0.001 wt % to 10 wt %, preferably from 0.005 wt % to 5 wt %, and more preferably from 0.01 wt % to 1 wt %.

The backlight unit 20 is coupled to the second substrate 14 of the liquid crystal display element 10, and emits a light having a color temperature ranging from 8,000 K to 20,000 K. The useful examples of the backlight unit 20 include, but are not limited to, a white light emitting diode, a trichrome fluorescent lamp, or a combination thereof.

When the white light emitting diode is used as the backlight unit 20, in order to produce a color filter having chromaticity specified in EBU (European Broadcasting Union) standard, it is often required to increase the film thickness and/or the pigment concentration for blue pixels of a color filter. Therefore, the light transmittance of the blue pixels is undesirably reduced, the display properties of the liquid crystal display are deteriorated, and the color temperature of the liquid crystal display device is also undesirably reduced. Moreover, in the light-emitting mechanism for the white light emitting diode used as the backlight unit 20, blue light emitted from a light-emitting layer of a light-emitting die is absorbed by photoluminescent phosphor and is then transformed into light of an other color. Some energy is lost during the transformation. When the color temperature of the backlight unit 20 is lower than 8,000 K, the color temperature of the liquid crystal display device is also undesirably reduced so that the characteristics required for the liquid crystal television can not be satisfied. On the other hand, when the color temperature of the backlight unit 20 is higher than 20,000 K, the amount of the photoluminescent phosphor should be decreased. The luminescent intensity of the red light is reduced and the color reproduction is inferior. Therefore, the backlight unit 20 used in the present invention preferably has a color temperature ranging from 8,000 K to 20,000 K in view of the color reproduction of the color liquid crystal display.

In the case that the trichrome fluorescent lamp is used as the backlight unit 20, when the color temperature of the backlight unit 20 is lower than 8,000 K, the amount of blue phosphor should be decreased. The luminescent intensity of blue light is too low, which results in inferior color reproduction. On the other hand, when the color temperature of the backlight unit 20 is higher than 20,000 K, the amount of the red phosphor should be decreased. The luminescent intensity of the red light is reduced, which also results in inferior color reproduction.

When the white light emitting diode is used as the backlight unit 20, a light-emitting layer of a blue light emitting die is formed with a fluorescence filter film containing the photoluminescent phosphor on the surface thereof, or a package material of the blue light emitting die contains the photoluminescent phosphor. The light emitting layer of the blue light emitting die is made of a nitride compound semiconductor, a group compound semiconductor, a group II-IV compound semiconductor, a group IV-VI compound semiconductor, or combinations thereof, and has a main peak of luminescent spectrum ranging from 430 nm to 500 nm. Preferably, the light emitting layer of the blue light emitting die is made of InGaN or GaN material in combination with yellow phosphor and/or green phosphor and/or red phosphor so as to obtain the backlight unit 20 having the aforesaid desirable range of the color temperature.

Specifically, the photoluminescent phosphor includes at least one yellow or green phosphor selected from a cerium activated aluminum garnet phosphor, an alkaline earth metal silicate phosphor, or a combination thereof. When the photoluminescent phosphor is the yellow phosphor, the cerium activated aluminum garnet phosphor is a phosphor of $RE_3(Al, Ga)_5O_{12}$:Ce, a phosphor of $(Tb,Al)_5O_{12}$:Ce, or a combination thereof, wherein RE is Y, Gd, La, or combinations thereof. The alkaline earth metal silicate phosphor is a phosphor of $AE_2SiO_4$:Eu, a phosphor of $Sr_3SiO_5$:$Eu^{2+}$, or a combination thereof, wherein AE is Sr, Ba, Ca, or combinations thereof. When the photoluminescent phosphor is the green phosphor, the cerium activated aluminum garnet phosphor is a phosphor of $RE_3(Al, Ga)_5O_{12}$:Ce, wherein RE is Y, Gd, La, or combinations thereof. The alkaline earth metal silicate phosphor is a phosphor of $AE_2SiO_4$:Eu, a phosphor of $Ca_3Sc_2Si_3O_{12}$:Ce, or a combination thereof, wherein AE is Sr, Ba, Ca, or combinations thereof. Additionally, when the photoluminescent phosphor is the green phosphor, $Ca_3Sc_2O_4$:Ce can also be used as the green phosphor.

Preferably, the photoluminescent phosphor can further include a red phosphor of a europium activated phosphor, a europium activated sulfide phosphor, a europium activated nitride phosphor, or combinations thereof. The europium activated phosphor is $Y_2O_3$:Eu. The europium activated sulfide phosphor is $Y_2O_2S$:Eu, $La_2O_2S$:Eu, or a combination thereof. The europium activated nitride phosphor is $AE_2Si_5N_8$:$Eu^{2+}$, $CaAlSiN_3$:$Eu^{2+}$, $CaAlSiBN_3$:Eu, or combinations thereof, wherein AE is Sr, Ea, Ca, or combinations thereof.

Figure 2:
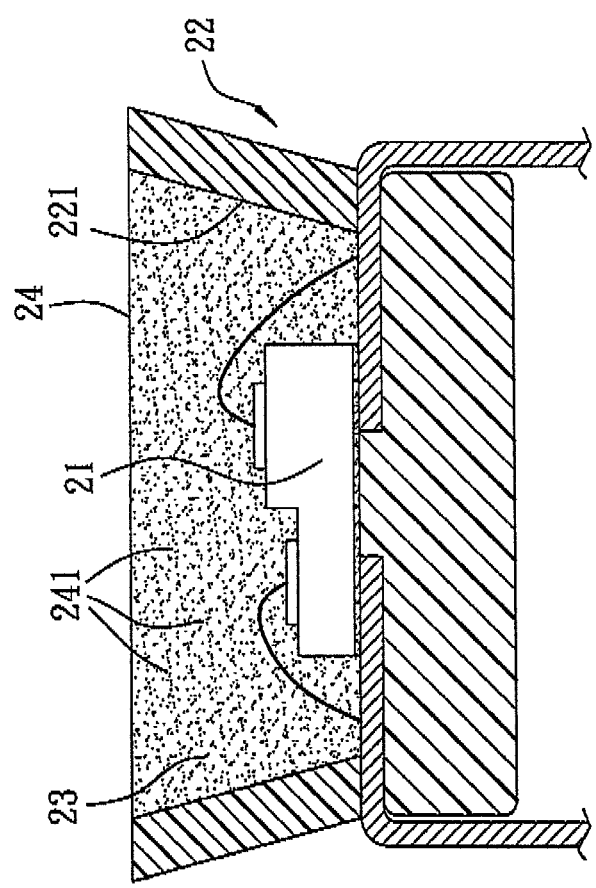
FIG. 2 is a sectional view of a white light emitting diode used in the preferred embodiment.

Specifically referring to FIG. 2, in the manufacturing of the white light emitting diode, a light-emitting die 21 and a substrate 22 are prepared. The light-emitting die 21 emits light having a primary wavelength of 460 nm. The substrate 22 has a recessed holding member 221 defining a receiving space 23. The recessed holding member 221 has a bottom portion electrically connected to an external power source.

The light-emitting die 21 is mounted on and electrically connected to the bottom portion of the recessed holding member 221. Polysiloxane resin containing the photoluminescent phosphor 241 is filled into the receiving space 23 until the polysiloxane resin is flush with the substrate 22. The polysiloxane resin is cured at 70'C for 3 hours and then at 150° C. for 1 hour so as to form a package layer 24 containing the photoluminescent phosphor 241.

When the trichrome fluorescent lamp is used as the backlight unit 20, the trichrome fluorescent lamp includes a phosphor combination including a blue phosphor, a green phosphor, and a red phosphor. If the amount of the blue phosphor is increased, the light emitted by the trichrome fluorescent lamp is bluish white, and the color temperature of the backlight unit 20 is increased. If the amount of the red phosphor is increased, the light emitted by the trichrome fluorescent lamp is reddish white, and the color temperature of the backlight unit 20 is decreased. In view of the color temperature, the blue phosphor is selected from $Sr_5(PO_4)_3Cl$:Eu, $(SrCaBa)_5(PO_4)_3Cl$:Eu, $BaMg_2Al_{16}O_{27}$:Eu, and combinations thereof, the green phosphor is selected from $LaPO_4$:Ce, $LaPO_4$:Tb, $LaPO_4$:CeTb, $(CeTb)MgAl_{14}O_{19}$, and combinations thereof, and the red phosphor is $Y_2O_3$:Eu. Preferably, the blue phosphor is in an amount ranging from 20 to 55 wt %, the green phosphor is in an amount ranging from 20 to 55 wt %, and the red phosphor is in an amount ranging from 20 to 45 wt % based on a total weight of the phosphor combination.

EXAMPLES

The following examples are provided to illustrate the preferred embodiments of the invention, and should not be construed as limiting the scope of the invention.

Synthesis of Alkali-Soluble Resin

Synthesis Example B-1

A 1000 ml four-necked conical flask equipped with a nitrogen inlet, a stirrer, a heater, a condenser and a thermometer was purged with nitrogen, and was added continuously with 45 parts by weight of 2-methacryloylethoxy succinate monoester (referred to as MOMS hereinafter), 15 parts by weight of styrene monomer (referred to as SM hereinafter), 10 parts by weight of dicyclopentenyloxyethyl acrylate (referred to as DCPOA hereinafter), 25 parts by weight of benzyl methacrylate (referred to as BzMA hereinafter), 5 parts by weight of methyl acrylate (referred to as MA hereinafter), and 200 parts by weight of ethyl 3-ethoxypropionate (referred to as EEP hereinafter, as a solvent).

The contents in the four-necked conical flask were stirred while the temperature of an oil bath was raised to 100° C. 4 parts by weight of 2,2'-azobis-2-methyl butyronitrile (referred to as AMEN hereinafter, as a polymerization initiator) dissolved in EEP was added into the four-necked conical flask in five aliquots within one hour. Polymerization was conducted at 1000 for 6 hours. Polymerization product was removed from the four-necked conical flask after the polymerization was complete. The solvent was evaporated so as to obtain an alkali-soluble resin (B-1).

Synthesis Examples B-2 and B-3

Synthesis Examples B-2 and B-3 were conducted in a manner identical to that of Synthesis Example 1 using the components, the amounts thereof, and the reaction conditions shown in Table 1.

Preparation Examples of Blue Photosensitive Resin Composition

Preparation Example a 100 parts by weight of the alkali-soluble resin (B-1) obtained from Synthesis Example B-1, 100 parts by weight of dipentaerythritol hexaacrylate (referred to as C-1 hereinafter, manufactured by Toagosei), 8 parts by weight of 1-[9-ethyl-6-(2-methylbenzoyl)-9H-carbazol-3-yl]-ethylketo 1-(O-acetyloxime) (referred to as D-1 hereinafter), 10 parts by weight of 2,2'-bis(2,4-dichlorophenyl)-4,4',5,5'-tetraphenyl-biimidazole (referred to as D-2 hereinafter), and 120 parts by weight of C.I. Pigment Blue 15:6 were added into 2,100 parts by weight of ethyl 3-ethoxypropionate (referred tows E-1 hereinafter, used as a solvent), and were mixed using a shaker to obtain a blue photosensitive resin composition.

Preparation Examples b to i

Preparation Examples b to i were conducted in a manner identical to that of Preparation Example a using the components and the amounts thereof shown in Table 2.

TABLE 1

Synthesis Examples of alkali-soluble resin:

| | Composition (parts by weight) | | | | | | | | | Polymerization conditions | | |
| | Monomers for Polymerization | | | | | | | Initiator | Solvent | Feeding | Reaction Temp. | Reaction Time |
| Syn. Ex. # | HOMS | MAA | SM | DCPOA | BzMA | PMI | MA | AMBN | EEP | manner | (° C.) | (hrs) |
| B-1 | 45 | | 15 | 10 | 25 | | 5 | 4 | 200 | Continuously | 100 | 6 |
| B-2 | | 35 | 10 | | 35 | 5 | 10 | 4 | 200 | Continuously | 100 | 6 |
| B-3 | 25 | 20 | 5 | 10 | 30 | | 5 | 4 | 200 | Continuously | 100 | 6 |

Note:
MAA: methacrylic acid
BzMA: benzyl methacrylate
SM: styrene monomer
MA: methyl acrylate
PMI: N-phenylmaleimide
AMBN: 2,2'-azobis-2-methyl butyronitrile
EEP: ethyl 3-ethoxypropionate
HOMS: 2-methacryloyloxyethyl succinate monoester
DCPOA: dicyclopentenyloxyethyl acrylate

TABLE 2

Preparation Examples a to i:

| Components (pbw) | | | a | b | c | d | e | f | g | h | i |
|---|---|---|---|---|---|---|---|---|---|---|---|
| Pigments | A-1 | C.I. Pigment Blue 15:6 | 120 | 99 | 72 | 45.0 | 36 | 100 | 28 | 15 | 5 |
| | | C.I. Pigment Blue 15:4 | | | | 7.5 | | | | | |
| | A-2 | C.I. Pigment Violet 23 | | 11 | 18 | 22.5 | 20 | | 28 | 35 | 45 |
| | | C.I. Pigment Violet 19 | | | | | 4 | | | | |
| | A-3 | C.I. Pigment Green 36 | | | | | | 25 | | | |
| | | C.I. Pigment Green 58 | | | 5 | | | | | | |
| Weight ratio (A-1)/(A-2) | | | 100/0 | 90/10 | 80/20 | 70/30 | 60/40 | 100/0 | 50/50 | 30/70 | 10/90 |
| Alkali-soluble resin | B-1 | | 100 | | | 90 | 90 | | 90 | | |
| | B-2 | | | 100 | | 90 | | 90 | | 90 | 90 |
| | B-3 | | | | 10 | 10 | 10 | 10 | 10 | 10 | 10 |
| A compound having an ethylenic group | C-1 | | 100 | 70 | 80 | 100 | 80 | 90 | 90 | 80 | 90 |
| | C-2 | | | 30 | 20 | | 20 | 10 | 10 | 20 | 10 |
| Photoinitiator | D-1 | | 8 | 10 | 9 | 10 | 8 | 10 | 8 | 8 | 10 |
| | D-2 | | 10 | | 10 | 4 | 6 | 5 | 5 | 6 | 4 |
| | D-3 | | | 8 | | 6 | 4 | 5 | 5 | 4 | 4 |
| Solvent | E-1 | | 2100 | | 2100 | | 1800 | | 2100 | 2100 | 2100 |
| | E-2 | | | 2100 | | 2100 | 300 | 2100 | | | |

Note:
C-1: pentaerythritol triacrylate (manufactured by Toagosei)
C-2: TO-1382 (manufactured by Toagosei)
D-1: 1-[9-ethyl-6-(2-methylbenzoyl)-9H-carbazol-3-yl]-ethylketo 1-(O-acetyloxime)
D-2: 2,2'-bis(2,4-dichlorophenyl)-4,4',5,5'-tetraphenylbiimidazole
D-3: 2,4-bis(trichloromethyl)-6-(p-methoxy)styryl-s-triazine
E-1: ethyl 3-ethoxypropionate
E-2: propylene glycol methyl ether acetate Preparation Example of Green Photosensitive Resin Composition Preparation Example G-1

A green photosensitive resin composition was prepared in a manner identical to that of Preparation Example a except the following were used: 150 parts by weight of C.I. Pigment Green 58, 100 parts by weight of C.I. Pigment Yellow 150, 100 parts by weight of the alkali-soluble resin (B-1) obtained from Synthesis Example B-1, 100 parts by weight of the ethylenic compound (C-1), 8 parts by weight of the photoinitiator (D-1), 10 parts by weight of the photoinitiator (D-2), and 2,100 parts by weight of the solvent (E-1).

Preparation Example G-2

A green photosensitive resin composition was prepared in a manner identical to that of Preparation Example G-1 except that 132 parts by weight of C.I. Pigment Green 36 and 108 parts by weight of C.I. Pigment Yellow 138 were used to replace 150 parts by weight of C.I. Pigment Green 58 and 100 parts by weight of C.I. Pigment Yellow 150.

Preparation Example of Red Photosensitive Resin Composition

Preparation Example R-1

A red photosensitive resin composition was prepared in a manner identical to that of Preparation Example a except the following were used: 160 parts by weight of C.I. Pigment Red 177, 40 parts by weight of C.I. Pigment Red 166, 20 parts by weight of C.I. Pigment Yellow 150, 100 parts by weight of the alkali-soluble resin (B-1) obtained from Synthesis Example B-1, 100 parts by weight of the ethylenic compound (C-1), 8 parts by weight of the photoinitiator (D-1), 10 parts by weight of the photoinitiator (D-2), and 2,100 parts by weight of the solvent (E-1).

Preparation Example R-2

A red photosensitive resin composition was prepared in a manner identical to that of Preparation Example R-1 except that 180 parts by weight of C.I. Pigment Red 254 and 20 parts by weight of C.I. Pigment Yellow 177 were used to replace 160 parts by weight of C.I. Pigment Red 177, 40 parts by weight of C.I. Pigment Red 166, and 20 parts by weight of C.I. Pigment Yellow 150.

Preparation of a Color Filter

Preparation Example 11-a

The blue photosensitive resin composition obtained in Preparation Example a was spin-coated on a glass substrate, dried under a pressure of 100 mmHg for 30 seconds, and was pre-baked at a temperature of 80° C. for 3 minutes to form a pre-baked film having a thickness of 2.5 µm. The pre-baked film was exposed using a mask aligner (Canon PLA-501F, 300 mJ/cm$^2$), was immersed into a developer solution at a temperature of 23° C. for 2 minutes, was washed with water, and was post-baked at a temperature of 200° C. for 80 minutes to form a blue pixel pattern. The aforesaid procedure was repeated to form a green pixel pattern and a red pixel pattern using the green photosensitive resin composition obtained in Preparation Example G-1 and the red photosensitive resin composition obtained in Preparation Example R-1, respectively. A pixel layer having a thickness of about 2.0 µm was obtained thereby.

An ITO (indium tin oxide) film was deposited on the pixel layer at a temperature of 235° C. under vacuum. The ITO film can be etched and formed with a wiring layout, if necessary. A color filter was obtained thereby.

Preparation Examples 11-b to 11-i

Preparation Examples 11-b to 11-i were conducted in a manner identical to that of Preparation Example 11-a using the blue photosensitive resin compositions obtained in Preparation Examples b to i.

Preparation Example 11-j

Preparation Examples 11-j was conducted in a manner identical to that of Preparation Example 11-b except that the red photosensitive resin composition obtained in Preparation Example R-2 and the green photosensitive resin composition obtained in Preparation Example G-2 were used to respectively replace the red and green photosensitive resin compositions used in Preparation Example 11-b.

CIE chromaticity coordinate values of the color filters made in Preparation Examples 11-a to 11-j were determined using a colorimeter (manufactured by Otsuka Electronics Co., Model N. MCPD). The z values in the CIE chromaticity coordinate values of the color filters made in Preparation Examples 11-a to 11-j are shown in Table 3.

TABLE 3

| | Color filters | | | | | | | | | |
|---|---|---|---|---|---|---|---|---|---|---|
| Components | 11-a | 11-b | 11-c | 11-d | 11-e | 11-f | 11-g | 11-h | 11-i | 11-j |
| Blue photosensitive resin compositions | a | b | c | d | e | f | g | h | i | b |
| Red photosensitive resin compositions | | | | | R-1 | | | | | R-2 |
| Green photosensitive resin compositions | | | | | G-1 | | | | | G-2 |
| Z values | 0.46 | 0.44 | 0.41 | 0.36 | 0.32 | 0.38 | 0.27 | 0.21 | 0.77 | 0.45 |

Preparation of a Liquid Crystal Display Element

Polyimide was applied on an ITO layer deposited on each of the substrate formed with the color filter and a substrate formed with a thin film transistor and was heated to form an alignment layer. The two substrates were arranged to oppose each other with a space (cell gap). The peripheral portions of the two substrates were joined together with a sealing agent, liquid crystals were filled into the cell gap defined by the surfaces of the substrates and the sealing agent, and an injection hole was sealed up to form a liquid crystal cell. Then, a polarizer was affixed to the exterior sides of the liquid crystal cell to obtain the liquid crystal display element. It should be noted that twisted nematic liquid crystal, super twisted nematic liquid crystallin-plane switching liquid crystal, vertical alignment liquid crystal, optically compensated birefringence liquid crystal, ferroelectric liquid crystal, or the like can be used in the present invention.

Preparation of a Backlight Unit

Preparation Examples 20-1-1 to 20-1-5

A blue light-emitting die of InGaN (manufactured by Chi Mei Lighting Technology Corp., light-emitting wavelength of 460 nm) was mounted on a recessed holding member and was electrically connected to a bottom portion of the recessed holding member. Polysiloxane resin containing yellow phosphor and red phosphor in a blending ratio shown in Table 4 was filled into a receiving space defined by the recessed holding member until the polysiloxane resin was flush with the recessed holding member. The polysiloxane resin was cured to obtain a white light emitting diode used as the backlight unit.

TABLE 4

Preparation Examples of a white light emitting diode used as a backlight unit

| Prep. Ex. # | Yellow phosphor | Pbw | Red phosphor | pbw | Color temp. (K) |
|---|---|---|---|---|---|
| 20-1-1 | $(SrBa)_2SiO_4$:Eu | 18 | $CaAlSiBN_3$:Eu | 2.5 | 3934 |
| 20-1-2 | $(SrBa)_2SiO_4$:Eu | 16 | $CaAlSiBN_3$:Eu | 2 | 8090 |
| 20-1-3 | $Y_3(Al,Ga)_5O_{12}$:Ce | 14.5 | $CaAlSiBN_3$:Eu | 1.5 | 13532 |
| 20-1-4 | $Y_3(Al,Ga)_5O_{12}$:Ce | 13.2 | $Y_2O_3$:Eu | 0.9 | 19805 |
| 20-1-5 | $Y_3(Al,Ga)_5O_{12}$:Ce | 11 | $Y_2O_3$:Eu | 0.5 | 22260 |

Note:
1. pbw: parts by weight
2. light-emitting wavelength of $(SrBa)_2SiO_4$:Eu: 550-570 nm
3. light-emitting wavelength of $Y_3(Al,Ga)_5O_{12}$:Ce: 520-550 nm
4. light-emitting wavelength of $CaAlSiBN_3$:Eu: 650-670 nm
5. light-emitting wavelength of $Y_2O_3$:Eu: 610-630 nm Preparation Examples 20-2-1 to 20-2-5

Red phosphor of $Y_2O_3$:Eu, green phosphor of $LaPO_4$:Ce, Tb, and blue phosphor of $(SrCaBa)_5(PO_4)_3Cl$:Eu were blended together in a blending ratio shown in Table 5 to obtain a phosphor blend, which was mixed with a butyl acetate solution of nitrocellulose to obtain a suspension. The suspension was applied to an inner surface of a glass tube having an inner diameter of 32 mm and was dried to form a coating layer on the inner surface of the glass tube. The coating layer was baked at a temperature of 500° C. to form a trichrome fluorescent lamp of 40 W used as the backlight unit. The color temperature of each of the trichrome fluorescent lamps obtained in Preparation Examples 20-2-1 to 20-2-5 are also shown in Table 5.

TABLE 5

Preparation examples of a trichrome fluorescent lamp used as the backlight unit

| Prep. Ex. # | Blending ratio | | | Color temp. (K) |
| --- | --- | --- | --- | --- |
| | Red phosphor (%) | Green phosphor (%) | Blue phosphor (%) | |
| 20-2-1 | 40 | 35 | 25 | 3512 |
| 20-2-2 | 35 | 34 | 31 | 8125 |
| 20-2-3 | 33 | 33 | 34 | 13845 |
| 20-2-4 | 31 | 32 | 37 | 19780 |
| 20-2-5 | 30 | 30 | 40 | 22122 |

Red phosphor: $Y_2O_3$:Eu
Green phosphor: $LaPO_4$:Ce,Tb
Blue phosphor: $(SrCaBa)_5(PO_4)_3Cl$:Eu Measurement of Color Temperature of a Backlight Unit:

CIE chromaticity coordinate value of a backlight unit was determined using a colorimeter (manufactured by Otsuka Electronics Co., Model No. MCPD). Color temperature of the backlight unit could be determined from the chromaticity coordinate value and isotemperature line.

Examples of Color Liquid Crystal Display Device

Example 1

The liquid crystal display element made from the color filter obtained in Preparation Example 11-a was coupled to the backlight unit obtained in Preparation Example 20-2-2 to obtain a color liquid display device, which was evaluated according to the following evaluation methods. The evaluation results are shown in Table 6.

Measurement of Color Reproduction of NTSC:

CIE chromaticity coordinate value of a color liquid crystal display device was determined using a colorimeter (manufactured by Otsuka Electronics Co., Model No. MCPD). NTSC ratio of the color liquid crystal display device could be calculated by dividing a color gamut of the determined CIE chromaticity coordinate value by a color gamut of a CIE standard chromaticity diagram. The higher the NTSC ratio, the better the color reproduction will be.

◎: NTSC ratio≥90%
○: 90%≤NTSC ratio<85%
Δ: 85%≤NTSC ratio<80%
X: NTSC ratio<80%

Examples 2 to 6

Examples 2 to 6 were conducted in a manner identical to that of Example 1 using the color filters and the backlight units shown in Table 6. The evaluation results of the color reproduction of Examples 2 to 6 are also shown in Table 6.

TABLE 6

| Color liquid crystal display devices | | Examples | | | | | |
| --- | --- | --- | --- | --- | --- | --- | --- |
| | | 1 | 2 | 3 | 4 | 5 | 6 |
| Color filters | | 11-a | 11-b | 11-c | 11-d | 11-e | 11-f |
| Weight ratio of (A-1)/(A-2) | | 100/0 | 90/10 | 80/20 | 70/30 | 60/40 | 100/0 |
| Backlight units | | 20-2-2 | 20-2-3 | 20-2-4 | 20-1-2 | 20-1-3 | 20-1-4 |
| Color temp. of backlight units | | 8125 | 13845 | 19780 | 8090 | 13532 | 19805 |
| Results | NTSC Color reproduction | ○ | ◎ | ◎ | ○ | Δ | ○ |

Comparative Examples 1 to 11

Comparative Examples 1 to 11 were conducted in a manner identical to that of Example 1 using the color filters and the backlight units shown in Table 7. The evaluation results of Comparative Examples 1 to 11 are also shown in Table 7.

TABLE 7

| Color liquid crystal display devices | Comparative Examples | | | | | | | |
| --- | --- | --- | --- | --- | --- | --- | --- | --- |
| | 1 | 2 | 3 | 4 | 5 | 6 | 7 | 8 |
| Color filters | 11-a | 11-b | 11-c | 11-d | 11-g | 11-h | 11-i | 11-j |
| Weight ratio of (A-1)/(A-2) | 100/0 | 90/10 | 80/20 | 70/30 | 50/50 | 30/70 | 10/90 | 90/10 |
| Z value of chromaticity coordinate | 0.46 | 0.44 | 0.41 | 0.36 | 0.27 | 0.21 | 0.77 | 0.45 |
| Backlight unit | 20-2-1 | 20-2-5 | 20-1-1 | 20-1-5 | 20-2-2 | 20-2-3 | 20-2-4 | C light source |

TABLE 7-continued

| Color liquid crystal | Comparative Examples | | | | | | | |
|---|---|---|---|---|---|---|---|---|
| display devices | 1 | 2 | 3 | 4 | 5 | 6 | 7 | 8 |
| Color temp. of backlight unit | 3512 | 22122 | 3934 | 22260 | 8125 | 13845 | 19780 | 6774 |
| result  NTSC Color reproduction | X | X | X | X | X | X | X | X |

As shown in Table 6, a color liquid crystal display device having good NTSC color reproduction can be obtained when a weight ratio of (A-1) a copper phthalocyanine-based blue pigment to (A-2) a dioxazine-based violet pigment in the pigment combination of the blue filter segment is controlled to be within a range from 60/40 to 100/0 and a color temperature of a backlight unit is controlled to be within a range from 8,000 K to 20,000 K.

In view of the aforesaid, a color liquid crystal display device having good NTSC color reproduction can be obtained by the present invention when the weight ratio of (A-1) a copper phthalocyanine-based blue pigment to (A-2) a dioxazine-based violet pigment in the pigment combination of the blue filter segment is controlled to be within a range from 60/40 to 100/0, the color filter has a z value ranging from 0.3 to 0.5 in a chromaticity diagram of a XYZ color system, and a color temperature of a backlight unit is controlled to be within a range from 8,000 K to 20,000 K.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A color liquid crystal display device, comprising: a liquid crystal display element including a color filter having a red filter segment, a green filter segment, and a blue filter segment, said blue filter segment being prepared from a blue photosensitive resin composition which includes a pigment combination, an alkali-soluble resin, a compound having an ethylenic group, and a photoinitiator, said pigment combination including a copper phthalocyanine-based blue pigment, said color filter having a z value ranging from 0.3 to 0.5 in a chromaticity diagram of a XYZ color system; and a backlight unit coupled to said liquid crystal display element and having a color temperature ranging from 8,000 K to 20,000 K
wherein said pigment combination further includes a dioxazine-based violet pigment, a weight ratio of said copper phthalocyanine-based blue pigment to said dioxazine-based violet pigment being not less than 80/20, and
wherein said photoinitiator includes an O-acyloxime compound.

2. The color liquid crystal display device as claimed in claim 1, wherein said pigment combination further includes a dioxazine-based violet pigment, a weight ratio of said copper phthalocyanine-based blue pigment to said dioxazine-based violet pigment being not less than 60/40.

3. The color liquid crystal display device as claimed in claim 2, wherein said weight ratio of said copper phthalocyanine-based blue pigment to said dioxazine-based violet pigment is not less than 70/30.

4. The color liquid crystal display device as claimed in claim 2, wherein a total amount of said copper phthalocyanine-based blue pigment and said dioxazine-based violet pigment is not less than 80 wt % based on a weight of said pigment combination.

5. The color liquid crystal display device as claimed in claim 1, wherein said copper phthalocyanine-based blue pigment includes C.I. Pigment Blue 15:6.

6. The color liquid crystal display device as claimed in claim 5, wherein said C.I. Pigment Blue 15:6 is used in an amount not less than 80 wt % based on a weight of said copper phthalocyanine-based blue pigment.

7. The color liquid crystal display device as claimed in claim 2, wherein said dioxazine-based violet pigment includes C.I. Pigment Violet 23.

8. The color liquid crystal display device as claimed in claim 7, wherein said C.I. Pigment Violet 23 is used in an amount not less than 15 wt % based on a weight of said dioxazine-based violet pigment.

9. The color liquid crystal display device as claimed in claim 1, wherein said pigment combination further includes a green pigment.

10. The color liquid crystal display device as claimed in claim 1, wherein said backlight unit is selected from a group consisting of a white light emitting diode, a trichrome fluorescent lamp, and a combination thereof.

11. The color liquid crystal display device as claimed in claim 10, wherein said backlight unit is said white light emitting diode including a light emitting layer having a main peak of luminescent spectrum ranging from 430 nm to 500 nm, and a photoluminescent phosphor, said light emitting layer being made of a material selected from a group consisting of a nitride compound semiconductor, a group III-V compound semiconductor, a group II-IV compound semiconductor, a group IV-VI compound semiconductor, and combinations thereof.

12. The color liquid crystal display device as claimed in claim 11, wherein said photoluminescent phosphor includes a yellow or green phosphor selected from a group consisting of a cerium activated aluminum garnet phosphor, an alkaline earth metal silicate phosphor, and a combination thereof.

13. The color liquid crystal display device as claimed in claim 12, wherein said photoluminescent phosphor is a yellow phosphor, said cerium activated aluminum garnet phosphor being selected from a group consisting a phosphor of $RE_3(Al,Ga)_5O_{12}:Ce$, a phosphor of $(Tb,Al)_5O_{12}:Ce$, and a combination thereof, wherein RE is selected from a group consisting of Y, Gd, La, and combinations thereof, said alkaline earth metal silicate phosphor being selected from a group consisting of a phosphor of $AE_2SiO_4:Eu$, a phosphor of $Sr_3SiO_5:Eu^{2+}$, and a combination thereof, wherein AE is selected from a group consisting of Sr, Ba, Ca, and combinations thereof.

14. The color liquid crystal display device as claimed in claim 12, wherein said photoluminescent phosphor is a green phosphor, said cerium activated aluminum garnet phosphor being a phosphor of $RE_3(Al,Ga)_5O_{12}$:Ce, wherein RE is selected from a group consisting of Y, Gd, La, and combinations thereof, said alkaline earth metal silicate phosphor being selected from a group consisting of a phosphor of $AE_2SiO_4$:Eu, a phosphor of $Ca_3Sc_2Si_3O_{12}$:Ce, and a combination thereof, wherein AE is selected from a group consisting of Sr, Ba, Ca, and combinations thereof.

15. The color liquid crystal display device as claimed in claim 12, wherein said photoluminescent phosphor includes a green phosphor selected from a group consisting of $RE_3(Al,Ga)_5O_{12}$:Ce, $AE_2SiO_4$:Eu, $Ca_3Sc_2Si_3O_{12}$:Ce, $Ca_3Sc_2O_4$:Ce, and combinations thereof, wherein RE is selected from a group consisting of Y, Gd, La, and combinations thereof, and wherein AE is selected from a group consisting of Sr, Ba, Ca, and combinations thereof.

16. The color liquid crystal display device as claimed in claim 12, wherein said photoluminescent phosphor further includes a red phosphor selected from a group consisting of a europium activated phosphor, a europium activated sulfide phosphor, a europium activated nitride phosphor, and combinations thereof.

17. The color liquid crystal display device as claimed in claim 16, wherein said europium activated phosphor is $Y_2O_3$:Eu, said europium activated sulfide phosphor being selected from a group consisting of $Y_2O_2S$:Eu, $La_2O_2S$:Eu, and combinations thereof, said europium activated nitride phosphor being selected from a group consisting of $AE_2Si_5N_8$:$Eu^{2+}$, $CaAlSiN_3$:$Eu^{2+}$, $CaAlSiBN_3$:Eu, and combinations thereof, wherein AE is selected from a group consisting of Sr, Ba, Ca, and combinations thereof.

18. The color liquid crystal display device as claimed in claim 10, wherein said backlight unit is said trichrome fluorescent lamp which includes a phosphor combination including a blue phosphor, a green phosphor, and a red phosphor.

19. The color liquid crystal display device as claimed in claim 18, wherein said blue phosphor is selected from a group consisting of $Sr_5(PO_4)_3Cl$:Eu, $(SrCaBa)_5(PO_4)_3Cl$:Eu, $BaMg_2Al_{16}O_{27}$:Eu, and combinations thereof, said green phosphor is selected from a group consisting of $LaPO_4$:Ce, $LaPO_4$:Tb, $LaPO_4$:CeTb, $(CeTb)MgAl_{14}O_{19}$, and combinations thereof, and said red phosphor is $Y_2O_3$:Eu.

20. The color liquid crystal display device as claimed in claim 18, wherein said blue phosphor is in an amount ranging from 20 to 55 wt %, said green phosphor is in an amount ranging from 20 to 55 wt %, and said red phosphor is in an amount ranging from 20 to 45 wt % based on a total weight of said phosphor combination.

21. The color liquid crystal display device as claimed in claim 1, wherein said weight ratio of said copper phthalocyanine-based blue pigment to said dioxazine-based violet pigment ranges from 80/20 to 90/10.

* * * * *